(12) United States Patent
Takagi

(10) Patent No.: US 7,972,034 B2
(45) Date of Patent: Jul. 5, 2011

(54) LASER LIGHT SOURCE, LASER LIGHT SOURCE UNIT, ILLUMINATION DEVICE, MONITOR APPARATUS, AND IMAGE DISPLAY APPARATUS

(75) Inventor: Kunihiko Takagi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 631 days.

(21) Appl. No.: 12/006,968

(22) Filed: Jan. 8, 2008

(65) Prior Publication Data

US 2008/0192206 A1 Aug. 14, 2008

(30) Foreign Application Priority Data

Feb. 13, 2007 (JP) ................................ 2007-031625

(51) Int. Cl.
*G02B 27/20* (2006.01)
*H01S 3/10* (2006.01)
*H01S 3/04* (2006.01)
*F21V 29/00* (2006.01)
*B60Q 1/06* (2006.01)
*G03B 21/26* (2006.01)

(52) U.S. Cl. .............. 362/259; 372/36; 372/28; 372/34; 353/28; 362/294; 362/373

(58) Field of Classification Search ............. 372/36, 372/34, 28; 362/249, 259
See application file for complete search history.

(56) References Cited

U.S. PATENT DOCUMENTS

| | | | | | |
|---|---|---|---|---|---|
| 3,780,795 | A | * | 12/1973 | Arnold | 165/80.2 |
| 5,172,755 | A | * | 12/1992 | Samarov | 165/80.3 |
| 5,559,824 | A | * | 9/1996 | Baird et al. | 372/95 |
| 5,729,561 | A | * | 3/1998 | Hironaka | 372/36 |
| 6,084,895 | A | * | 7/2000 | Kouchi et al. | 372/36 |
| 6,433,345 | B1 | | 8/2002 | Hayashi et al. | |
| 6,480,389 | B1 | * | 11/2002 | Shie et al. | 361/707 |
| 6,920,046 | B2 | * | 7/2005 | Spryshak | 361/704 |
| 6,975,294 | B2 | | 12/2005 | Manni et al. | |
| 7,062,311 | B1 | | 6/2006 | Sendai et al. | |
| 7,100,281 | B2 | * | 9/2006 | Kemink et al. | 29/890.054 |
| 7,120,177 | B2 | * | 10/2006 | Yamanaka et al. | 372/34 |
| 7,309,145 | B2 | * | 12/2007 | Nagata et al. | 362/294 |
| 7,632,716 | B2 | * | 12/2009 | Muraki et al. | 438/122 |
| 2006/0023173 | A1 | | 2/2006 | Mooradian et al. | |
| 2006/0023757 | A1 | | 2/2006 | Mooradian et al. | |
| 2006/0268241 | A1 | | 11/2006 | Watson et al. | |
| 2006/0280219 | A1 | | 12/2006 | Shchegrov | |
| 2007/0153862 | A1 | | 7/2007 | Shchegrov et al. | |
| 2007/0153866 | A1 | | 7/2007 | Shchegrov et al. | |

FOREIGN PATENT DOCUMENTS

| | | | |
|---|---|---|---|
| JP | 63-196166 | A | 8/1988 |
| JP | 04-192483 | A | 7/1992 |
| JP | 10-321953 | A | 12/1998 |
| JP | 2004-503923 | A | 2/2000 |

(Continued)

OTHER PUBLICATIONS

Aram Mooradian, et al., High Power Extended Vertical Cavity Surface Emitting Diode Lasers and Arrays and Their Applications, Micro-Optics Conference, Nov. 2, 2005, pp. 1-4, Tokyo.

*Primary Examiner* — Jong-Suk (James) Lee
*Assistant Examiner* — David J Makiya
(74) *Attorney, Agent, or Firm* — AdvantEdge Law Group, LLC

(57) ABSTRACT

A laser light source includes: a laser array in which plural emitters are arranged; and a submount having first and second surfaces facing in opposite directions. The laser array is provided on the first surface. A distance between the first surface and the second surface of the submount varies along an array arrangement direction of the laser array.

13 Claims, 7 Drawing Sheets

FOREIGN PATENT DOCUMENTS

| | | |
|---|---|---|
| JP | 2001-070227 A | 3/2001 |
| JP | 2003-094727 A | 4/2003 |
| JP | 2005-347590 A | 12/2005 |
| JP | 2006-339511 A | 12/2006 |

* cited by examiner

LASER LIGHT SOURCE, LASER LIGHT SOURCE UNIT, ILLUMINATION DEVICE, MONITOR APPARATUS, AND IMAGE DISPLAY APPARATUS

BACKGROUND

1. Technical Field

The present invention relates to a laser light source, a laser light source unit, an illumination device, a monitor apparatus, and an image display apparatus.

2. Related Art

A semiconductor laser element generates heat at the time of light irradiation, and thus, in the related art, a scheme that a semiconductor laser device is formed by fixing a semiconductor laser element on a submount formed of a material good in thermal conductivity for easily releasing heat to the outside has been proposed (e.g., see JP-A-2005-347590).

However, a semiconductor laser array is easy to release heat at both ends closer to the outer circumference and hard to release heat at the center, and thus, the temperature is higher at the center than at the both ends. Thereby, there are temperature differences among the respective light exiting regions (emitters) of the semiconductor laser array. Sometimes the semiconductor laser elements are arrayed for increasing output at a specific oscillation wavelength, however, there is a problem that the laser output decreases at the specific wavelength because the oscillation wavelengths differ from one light exiting region to another when there are temperature differences among the respective light exiting regions.

Especially, when the array is used in combination with a wavelength conversion element, since the wavelength conversion element performs efficient conversion at a wavelength, there is a problem that the laser output from the light exiting region that oscillates at another wavelength decreases.

Further, in the case of using an external resonant mirror, since the wavelength at which laser oscillation is the most efficient differs from one light exiting region to another, there is a problem that the light exiting region that provides low laser output is emerged and the total output decreases because the match is impossible between the oscillation wavelengths in all light exiting regions and the laser wavelength of the resonance by the external resonant mirror.

SUMMARY

An advantage of some aspects of the invention is to provide a laser light source, a laser light source unit, an illumination device, a monitor apparatus, and an image display apparatus that enable efficient laser oscillation.

A laser light source according to an aspect of the invention includes a laser array in which plural emitters are arranged; and a submount having first and second surfaces facing in opposite directions. The laser array is provided on the first surface. A distance between the first surface and the second surface of the submount varies along an array arrangement direction of the laser array.

According to the aspect of the invention, the distance between the first surface and the second surface of the submount varies along the array arrangement direction of the laser array, and the temperature differences that distribute along the array arrangement direction can be held at constant. Thereby, the laser light source in which the oscillation wavelengths of the respective emitters are equal and laser oscillation is efficiently performed is provided.

In the laser light source, the first surface of the submount may be a flat surface, and the second surface of the submount may have at least one concave portion located in a region that at least overlaps with the laser array. Thereby, the laser array can be easily mounted without distortion.

In the laser light source, the first surface of the submount may be a flat surface, and the second surface of the submount may have at least one convex portion located in a region that at least overlaps with the laser array. Thereby, the laser array can be easily mounted without distortion.

The laser light source further includes a base plate having a surface on which the submount is provided with the second surface of the submount facing the surface; and a joining member provided between the base plate and the submount. A coefficient of thermal conductivity of the submount may be smaller than a coefficient of thermal conductivity of the joining member. Thereby, the coefficient of thermal conductivity from the submount to the base can be easily improved.

The laser light source further includes a base plate having a surface on which the submount is provided with the second surface of the submount facing the surface; and a joining member provided between the base plate and the submount. A coefficient of thermal conductivity of the submount may be larger than a coefficient of thermal conductivity of the joining member. Thereby, the coefficient of thermal conductivity from the submount to the base can be easily improved.

In the laser light source, the submount has at least two projecting portions on a peripheral part of the second surface, and lengths from the first surface to ends of the respective projecting portions may be equal to a length from the first surface to an end of the convex portion of the second surface. Thereby, it becomes easy to prevent the submount from inclining when the submount is provided on the base.

A laser light source unit according to an aspect of the invention includes the laser light source described above.

According to the aspect of the invention, the distance between the first surface and the second surface of the submount varies along the array arrangement direction of the laser array, and the temperature differences that distribute along the array arrangement direction can be held at constant. Thereby, the laser light source unit in which the oscillation wavelengths of the respective emitters are equal and laser oscillation is efficiently performed can be provided.

The laser light source unit may include a wavelength conversion element that converts a wavelength of light emitted from the laser light source. Thereby, the temperatures of the respective emitters are equal and the oscillation wavelengths are equal, and efficient conversion can be performed with the wavelength conversion element and the laser output of the converted wavelength can be easily improved.

The laser light source unit may include a wavelength selection element that selectively turns light at a specific wavelength back to the laser light source to allow the laser light source to laser oscillate at the specific wavelength. Thereby, the temperatures of the respective emitters are equal and the oscillation wavelengths are equal, and the wavelengths can be matched with the selected wavelength of an external resonant mirror and the laser output can be easily improved.

The laser light source unit may include a wavelength selection element of wave distribution type that wavelength-selects plural different wavelengths at different locations; and a wavelength conversion element of wave distribution type that wavelength-converts plural different wavelengths at different locations. Thereby, the temperature differences are positively provided among the emitters and the oscillation wavelengths are positively distributed. Therefore, the wavelength selection element and wavelength conversion element of wave distribution type are combined, and speckles produced when the laser light source unit is used as a light source of a display can be easily reduced.

An illumination device according to an aspect of the invention includes the laser light source unit described above.

According to the aspect of the invention, the distance between the first surface and the second surface of the submount varies along the array arrangement direction of the laser array, and the temperature differences that distribute along the array arrangement direction can be held at constant. Thereby, the illumination device in which the oscillation wavelengths of the respective emitters are equal and laser oscillation is efficiently performed is provided.

A monitor apparatus according to an aspect of the invention includes: the laser light source unit described above; and an imaging unit that images a subject irradiated by the laser light source unit.

According to the aspect of the invention, the distance between the first surface and the second surface of the submount varies along the array arrangement direction of the laser array, and the temperature differences that distribute along the array arrangement direction can be held at constant. Thereby, the monitor apparatus in which the oscillation wavelengths of the respective emitters are equal and laser oscillation is efficiently performed is provided.

An image display apparatus according to an aspect of the invention includes: the laser light source unit described above; and a projection unit that projects light output from the laser light source unit and modulated according to an image signal.

According to the aspect of the invention, the distance between the first surface and the second surface of the submount varies along the array arrangement direction of the laser array, and the temperature differences that distribute along the array arrangement direction can be held at constant. Thereby, the image display apparatus in which the oscillation wavelengths of the respective emitters are equal and laser oscillation is efficiently performed is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

First Embodiment

Figure 1:
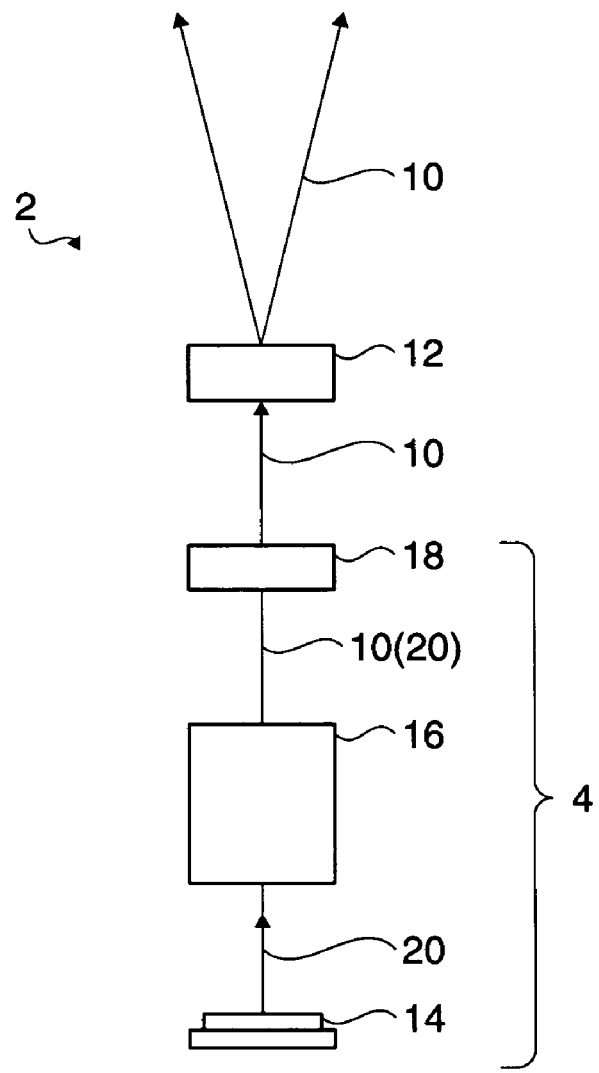
FIG. 1 is a schematic configuration diagram of an illumination device according to the first embodiment.

FIG. 1 is a schematic configuration diagram of an illumination device according to the first embodiment applying the invention. The illumination device 2 according to the embodiment includes a laser light source unit 4, and a diffusing element 12 that diffuses second harmonic wave (visible laser light) 10 emitted from the laser light source unit 4 as shown in FIG. 1. The laser light source unit 4 includes a laser light source 14, a wavelength conversion element 16, and a wavelength selection element 18. The laser light source 14 emits laser light 20.

The wavelength conversion element 16 is an element that causes a second harmonic generation (SHG) phenomenon, i.e., a second-order nonlinear optical phenomenon that two photons are converted into one photon with doubled frequency, and has a polarization reversed structure in a ferroelectric material. The wavelength conversion element 16 introduces the laser light 20 emitted from the laser light source 14 thereinto and wavelength-converts the light into the second harmonic (visible laser light) 10 in blue or green. The polarization reversed structure within the wavelength conversion element 16 is formed by electric field application method in an element using lithium niobate or lithium tantalate. The method of forming the polarization reversed structure is not limited to that method, and may be other methods such as the polarization reversing method by ion exchange and the microdomain reversing method with electron beam. Also the material is not limited to lithium niobate or lithium tantalate, and suitable materials for the respective methods may be used.

The wavelength selection element 18 has high reflectivity to the laser light 20 output from the wavelength conversion element 16 and high transmittance to the visible laser light 10.

By the configuration, an optical resonator is formed between the laser light source 14 and the wavelength selection element 18. The laser light 20 emitted from the laser light source 14 is confined within the optical resonator and passes through the wavelength conversion element 16 at many times.

The diffusing element 12 diffuses the visible laser light 10 emitted from the laser light source unit 4. As the diffusing element 12, for example, a diffusing lens, or a hologram element with a fringe pattern formed in advance for diffusion of incident light may be used.

Figure 2A:
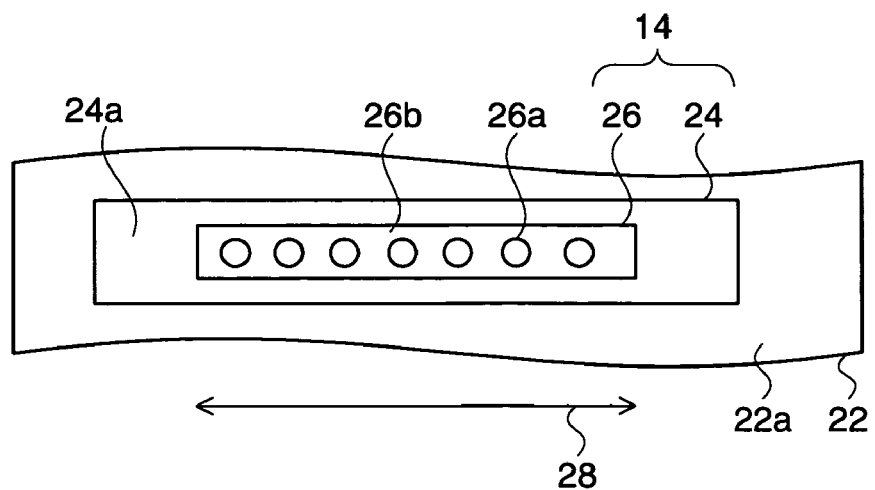
FIGS. 2A and 2B are schematic configuration diagrams of the laser light source according to the first and third embodiments.
Figure 2B:
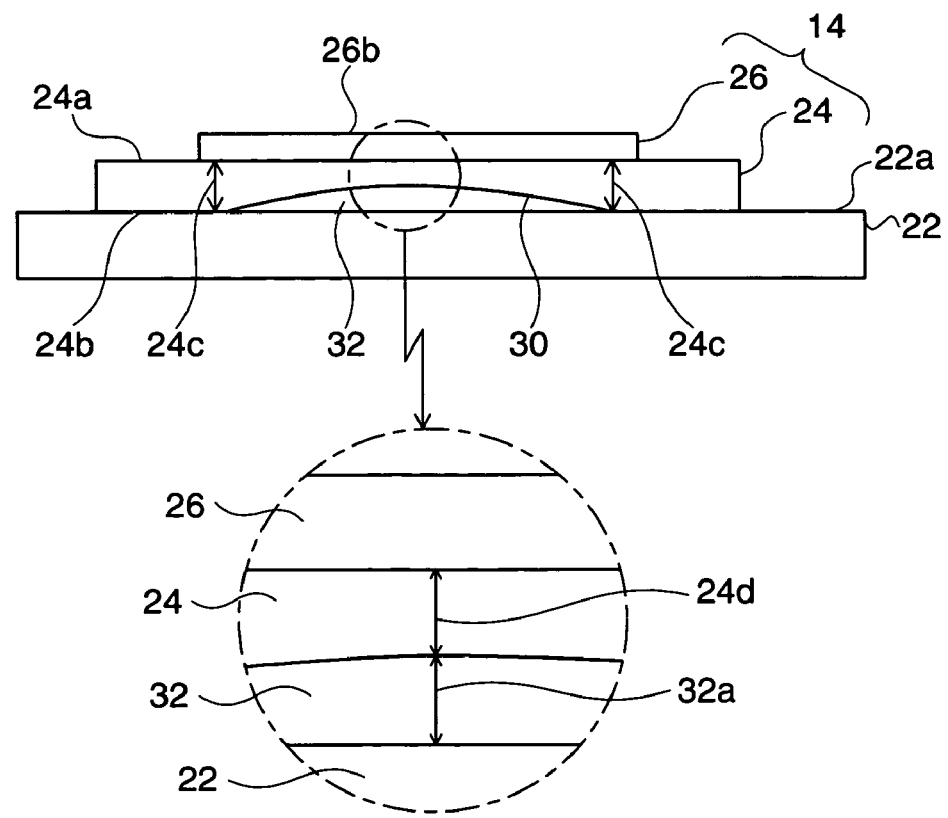

FIGS. 2A and 2B are schematic configuration diagrams of the laser light source according to the first embodiment applying the invention. FIG. 2A is a plan view of the laser light source and FIG. 2B is a side view of the laser light source with a partially enlarged view thereof. The laser light source 14 according to the embodiment is provided on a base plate 22. Further, the laser light source 14 includes a submount 24 that functions as a heat sink and a laser array 26 that functions as a light emitting element mounted on the submount 24.

The base plate 22 has a surface 22a. The laser light source 14 is disposed on the surface 22a. The wavelength conversion element 16 and the wavelength selection element 18 may be disposed on the surface 22a. The material of the base plate 22 is copper.

The submount 24 has first and second surfaces 24a, 24b facing in the opposite directions. The first surface 24a is a flat surface. The laser array 26 is provided on the first surface 24a.

The second surface 24b faces the surface 22a of the base plate 22. A concave portion 30 is located within a region at least overlapping with the laser array 26 of the second surface 24b. The concave portion 30 is located nearer the center side of the second surface 24b than the end surface of the laser array 26. The second surface 24b has at least one concave portion 30. The number of the concave portion 30 is one in the example of the drawing, however, not limited to one. Plural concave portions 30 may be provided on the second surface 24b. The concaved shape of the concave portion 30 has a gentle curve at the center in the example of the drawing, however, the concaved shape may be stepped or jagged. Or, the concave portion may have several kinds of shapes. Further, the center part may be concaved at a right angle or an acute angle.

The distance between the first surface 24a and the second surface 24b varies along the array arrangement direction 28 of the laser array 26. A distance 24c between the first surface 24a and the second surface 24b located at both ends is larger than a distance 24d between the first surface 24a and the second surface 24b (see the enlarged view) located at the center.

The submount 24 is formed of a material such as metal with good thermal conductivity, and has an elongated rectangular flat plate shape with a length of 10 to 12 mm, a width of 1 to 5 mm, and a thickness of 0.1 to 0.3 mm, for example. For the material of the submount 24, a known material such as a metal having a coefficient of thermal conductivity smaller than that of a joining member 32 for joining is used. For example, AlN (aluminum nitride) (coefficient of thermal conductivity: 200 W/mK), Cu—W (copper-tungsten composite material) (coefficient of thermal conductivity: 190 W/mK), Cu—Mo (copper-molybdenum composite material) (coefficient of thermal conductivity: 160 W/mK), etc. may be used.

The submount 24 is joined on the base plate 22 with the joining member 32. The joining member 32 is provided between the base plate 22 and the submount 24. The joining member 32 has a center thickness 32a larger than those at both ends. For the material of the joining member 32, a known material having a coefficient of thermal conductivity larger than that of the submount 24 to be joined is used. For example, Ag (coefficient of thermal conductivity: 420 W/mK) may be used. In the embodiment, the coefficient of thermal conductivity of the submount 24 is smaller than the coefficient of thermal conductivity of the joining member 32.

The laser array 26 includes plural emitters 26a arranged along the array arrangement direction 28. The laser array 26 is made using a material such as nitride semiconductor, and has an elongated rectangular flat plate shape with a length of 10 mm, a width of 0.5 to 3 mm, and a thickness of 0.1 to 0.2 mm, for example. The laser array 26 is called a VCSEL (Vertical-Cavity Surface-Emitting Laser) that emits the laser light 20 vertically relative to a substrate surface 26b and having a one-dimensional array structure in which the plural emitters 26a are arranged on a line. The number of emitters 26a is seven in the example of the drawing, however, not limited to seven. Although the VCSEL type is used as the laser light source 14 in the embodiment, an edge emitting laser array by which the direction of light resonation is in parallel with the substrate surface may be used instead. Further, the laser light source may be another kind of laser such as a solid laser, liquid laser, gas laser, or free electron laser in place of the semiconductor laser.

Figure 3:
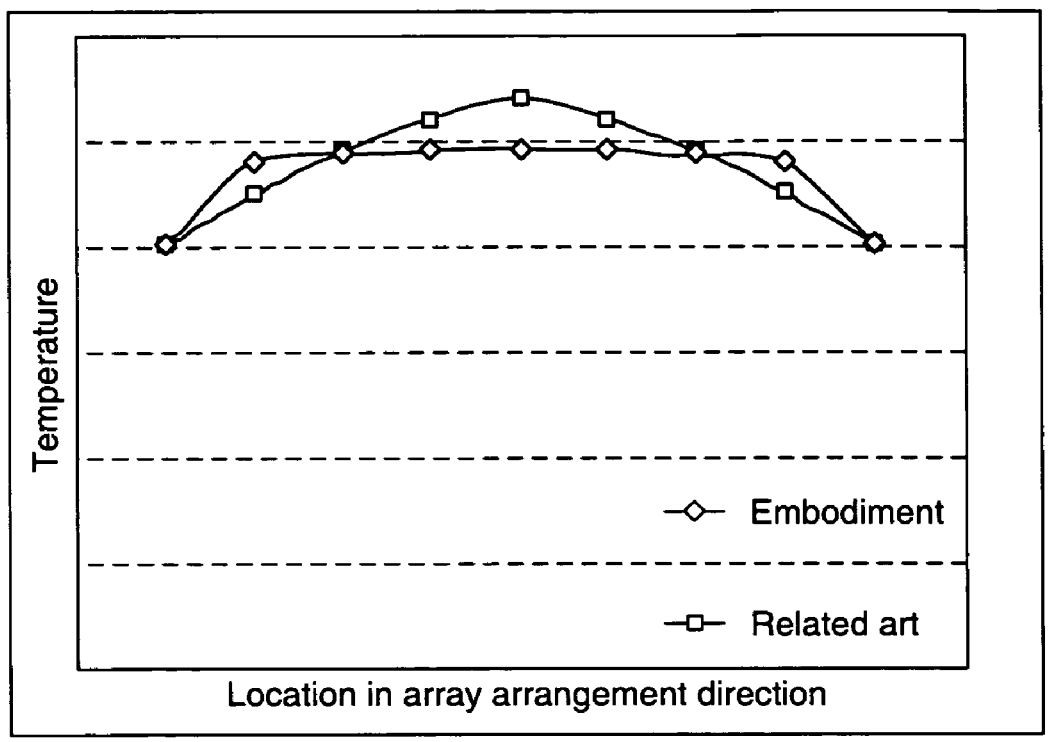
FIG. 3 shows a temperature distribution of a laser array in an array arrangement direction.

FIG. 3 shows a temperature distribution of the laser array 26 in the array arrangement direction 28. The horizontal axis indicates the location of the emitter 26a of the laser array 26, and the vertical axis indicates the temperature of the emitters 26a. In the related art, the temperature at the center where the heat generation of the emitters 26a is concentrated is higher than the other parts and the temperature is lower toward both ends in the array arrangement direction 28. In the embodiment, the temperature differences among other emitters (including the emitters 26a at the center where the heat generation of the emitters 26a is concentrated) than the emitters 26a at both ends in the array arrangement direction 28 are uniform and the temperatures is lower than the temperature of the emitters 26a at the center in the related art.

This is because the coefficient of thermal conductivity in combination of the submount 24 and the joining member 32 varies along the array arrangement direction 28. The thickness at both ends includes the distance 24c of the submount 24. Further, the center thickness thereof includes the distance 24d of the submount 24 and the thickness 32a of the joining member 32. Since the coefficient of thermal conductivity of the submount 24 is smaller than that of the joining member 32, the coefficient of thermal conductivity of the portion between the laser array 26 and the base plate 22 at the center in the array arrangement direction 28 is larger than the coefficient of thermal conductivity at both ends. Therefore, regarding the heat concentrated at the center of the laser array 26, the temperature differences of the laser array 26 in the array arrangement direction 28 may be made uniform by suitably setting the distances 24c, 24d between the first surface 24a and the second surface 24b of the submount 24.

As described above, in the first embodiment, the temperature differences among the respective emitters 26a may be made nearly equal. In the laser of the type using in combination with the wavelength conversion element 16, the oscillation wavelengths of all emitters 26a can be matched with the wavelength that is efficiently converted by the wavelength conversion element 16, and the laser output after wavelength conversion is increased. Further, in the laser of the type using the wavelength selection element 18, the oscillation wavelengths of all emitters 26a can be matched with the wavelength that is resonated in the wavelength selection element 18, and the laser output is increased.

Second Embodiment

Figure 4A:
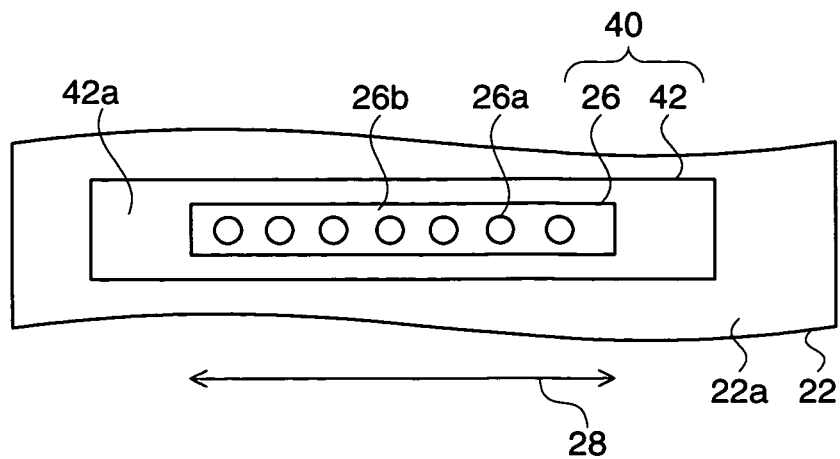
FIGS. 4A and 4B are schematic configuration diagrams of a laser light source according to the second and fourth embodiments.
Figure 4B:
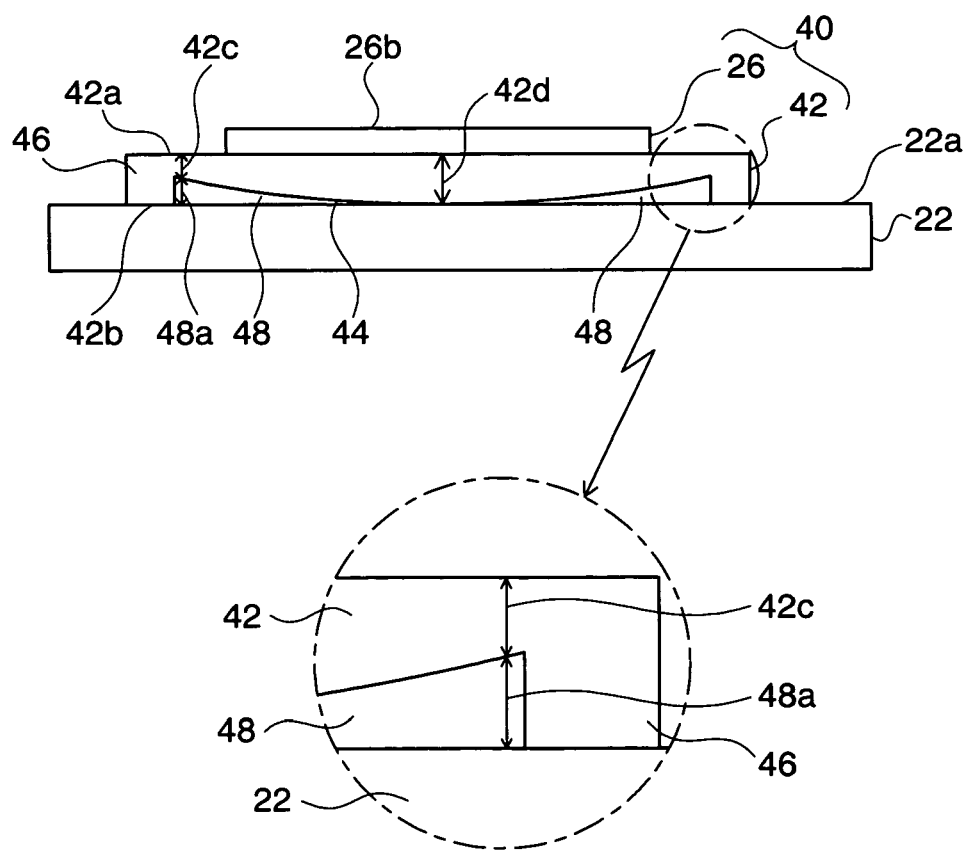

FIGS. 4A and 4B are schematic configuration diagrams of a laser light source according to the second embodiment applying the invention. FIG. 4A is a plan view of the laser light source and FIG. 4B is a side view of the laser light source with a partially enlarged view thereof. The laser light source 40 according to the embodiment is provided on a base plate 22. The base plate 22 has a surface 22a. The laser light source 40 is disposed on the surface 22a.

The laser light source 40 includes a laser array 26 that functions as a light emitting element mounted on a submount 42 that functions as a heat sink.

The submount 42 has first and second surfaces 42a, 42b facing in the opposite directions. The first surface 42a is a flat surface. The laser array 26 is provided on the first surface 42a.

The second surface 42b faces the surface 22a of the base plate 22. A convex portion 44 is located within a region at least overlapping with the laser array 26 of the second surface 42b. The convex portion 44 is located nearer the center side of the second surface 42b than the end surface of the laser array 26. The second surface 42b has at least one convex portion 44. The number of the convex portion 44 is one in the example of the drawing, however, not limited to one. Plural convex portions 44 may be provided on the second surface 42b. The convexed shape of the convex portion 44 has a gentle curve at the center in the example of the drawing, however, the convexed shape may be stepped or jagged. Or, the convex portion may have several kinds of shapes. Further, the portion may be convexed at a right angle or an acute angle.

The distance between the first surface 42a and the second surface 42b varies along the array arrangement direction 28 of the laser array 26. A distance 42d between the first surface 42a and the second surface 42b located at the center is larger than a distance 42c between the first surface 42a and the second surface 42b (see the enlarged view) located at both ends.

A projecting portion 46 is located on the peripheral part of the second surface 42b. The projecting portion 46 is located at the outer side than both ends of the array arrangement direction 28 of the laser array 26. The second surface 42b has at least two projecting portions 46. The number of projecting portions 46 is two in the example of the drawing, however, not limited two. The length from the first surface 42a to the end of the projecting portion 46 is equal to the length from the first surface 42a to the end of the convex portion 44. The projecting shape of the projecting portion 46 has a square in the example of the drawing, however, may have a curve. Or, the projecting shape may be stepped or jagged. Further, the projecting portion has several kinds of shapes. Furthermore, the portion may project at a right angle or an acute angle.

The submount 42 is joined on the base plate 22 with a joining member 48. The submount 42 is formed of a material such as metal with good thermal conductivity, and has an elongated rectangular flat plate shape with a length of 10 to 12 mm, a width of 1 to 5 mm, and a thickness of 0.1 to 0.3 mm, for example. For the material of the submount 42, a known material such as a metal having a coefficient of thermal conductivity larger than that of the joining member 48 for joining is used. For example, diamond (coefficient of thermal conductivity: 1500 to 2000 W/mK), a composite material of diamond and copper (coefficient of thermal conductivity: 500 W/mK), etc. may be used.

The joining member 48 is provided between the base plate 22 and the submount 42. The joining member 48 has a center thickness 48a larger than those at both ends. For the material of the joining member 48, a known material having a coefficient of thermal conductivity smaller than that of the submount 42 to be joined is used. For example, In (indium) (coefficient of thermal conductivity: 24 W/mK), a thermal conductive adhesive agent (coefficient of thermal conductivity: 15 to 30 W/mK), etc. may be used. In the embodiment, the coefficient of thermal conductivity of the submount 42 is larger than the coefficient of thermal conductivity of the joining member 48. The description of the first embodiment is applicable to the rest of the configuration.

Thereby, the coefficient of thermal conductivity in combination of the submount 42 and the joining member 48 varies along the array arrangement direction 28. The center thickness thereof includes the distance 42d of the submount 42. Further, the thickness of both ends thereof includes the distance 42c of the submount 42 and the thickness 48a of the joining member 48. Since the coefficient of thermal conductivity of the submount 42 is larger than that of the joining member 48, the coefficient of thermal conductivity between the laser array 26 and the base plate 22 in the array arrangement direction 28 is larger at the center than at both ends. Therefore, regarding the heat concentrated at the center of the laser array 26, the temperature differences of the laser array 26 in the array arrangement direction 28 may be made uniform by suitably setting the distances 42c, 42d between the first surface 42a and the second surface 42b of the submount 42.

Further, the projecting portion 46 at both ends is located at the outer side than ends of the laser array 26, and thus, the inclination of the submount 42 can be prevented at the time of mounting.

As described above, in the second embodiment, the temperature differences among the respective emitters 26a may be made nearly equal. In the laser of the type using in combination with the wavelength conversion element 16, the oscillation wavelengths of all emitters 26a can be matched with the wavelength that is efficiently converted by the wavelength conversion element 16, and the laser output after wavelength conversion is increased. Further, in the laser of the type using the wavelength selection element 18, the oscillation wavelengths of all emitters 26a can be matched with the wavelength that is resonated in the wavelength selection element 18, and the laser output is increased.

Third Embodiment

Regarding the drawing, FIGS. 2A and 2B used in the first embodiment is used. In the embodiment, for the material of the submount 24, a known material such as a metal having a coefficient of thermal conductivity larger than that of the joining member 32 for joining is used. For example, diamond (coefficient of thermal conductivity: 1500 to 2000 W/mK), a composite material of diamond and copper (coefficient of thermal conductivity: 500 W/mK), etc. may be used.

For the material of the joining member 32, a known material having a coefficient of thermal conductivity smaller than that of the submount 24 to be joined is used. For example, In (coefficient of thermal conductivity: 24 W/mK), a thermal conductive adhesive agent (coefficient of thermal conductivity: 15 to 30 W/mK), etc. may be used. In the embodiment, the coefficient of thermal conductivity of the submount 24 is larger than the coefficient of thermal conductivity of the joining member 32. The description of the first embodiment is applicable to the rest of the configuration.

Thereby, the coefficient of thermal conductivity in combination of the submount 24 and the joining member 32 varies along the array arrangement direction 28. The thickness at both ends includes the distance 24c of the submount 24. Further, the center thickness includes the distance 24d of the submount 24 and the thickness 32a of the joining member 32. Since the coefficient of thermal conductivity of the submount 24 is larger than that of the joining member 32, the coefficient of thermal conductivity between the laser array 26 and the base plate 22 in the array arrangement direction 28 is smaller at the center than at both ends. Therefore, the temperature differences of the laser array 26 in the array arrangement direction 28 may be made larger than in the case where such a configuration is not adopted.

As described above, in the third embodiment, the temperature differences among the respective emitters 26a are increased, and thus, the oscillation wavelengths can be changed with respect to each emitter 26a.

Fourth Embodiment

Regarding the drawing, FIGS. 4A and 4B used in the second embodiment is used. In the embodiment, for the material of the submount 42, a known material such as a metal having a coefficient of thermal conductivity smaller than that of the joining member 48 for joining is used. For example, AlN (aluminum nitride) (coefficient of thermal conductivity: 200 W/mK), Cu—W (copper-tungsten composite material) (coefficient of thermal conductivity: 190 W/mK), Cu—Mo (copper-molybdenum composite material) (coefficient of thermal conductivity: 160 W/mK), etc. may be used.

For the material of the joining member 48, a known material having a coefficient of thermal conductivity larger than that of the submount 42 to be joined is used. For example, Ag (coefficient of thermal conductivity: 420 W/mK) may be used. In the embodiment, the coefficient of thermal conductivity of the submount 42 is smaller than the coefficient of thermal conductivity of the joining member 48. The description of the second embodiment is applicable to the rest of the configuration.

Thereby, the coefficient of thermal conductivity in combination of the submount 42 and the joining member 48 varies along the array arrangement direction 28. The center thickness includes the distance 42d of the submount 42. Further, the thickness at both ends includes the distance 42c of the submount 42 and the thickness 48a of the joining member 48. Since the coefficient of thermal conductivity of the submount 42 is smaller than that of the joining member 48, the coefficient of thermal conductivity between the laser array 26 and the base plate 22 in the array arrangement direction 28 is smaller at the center than at both ends. Therefore, the temperature differences of the laser array 26 in the array arrangement direction 28 may be made larger than in the case where such a configuration is not adopted.

As described above, in the fourth embodiment, the temperature differences among the respective emitters 26a are increased, and thus, the oscillation wavelengths can be changed with respect to each emitter 26a.

Fifth Embodiment

Figure 5:
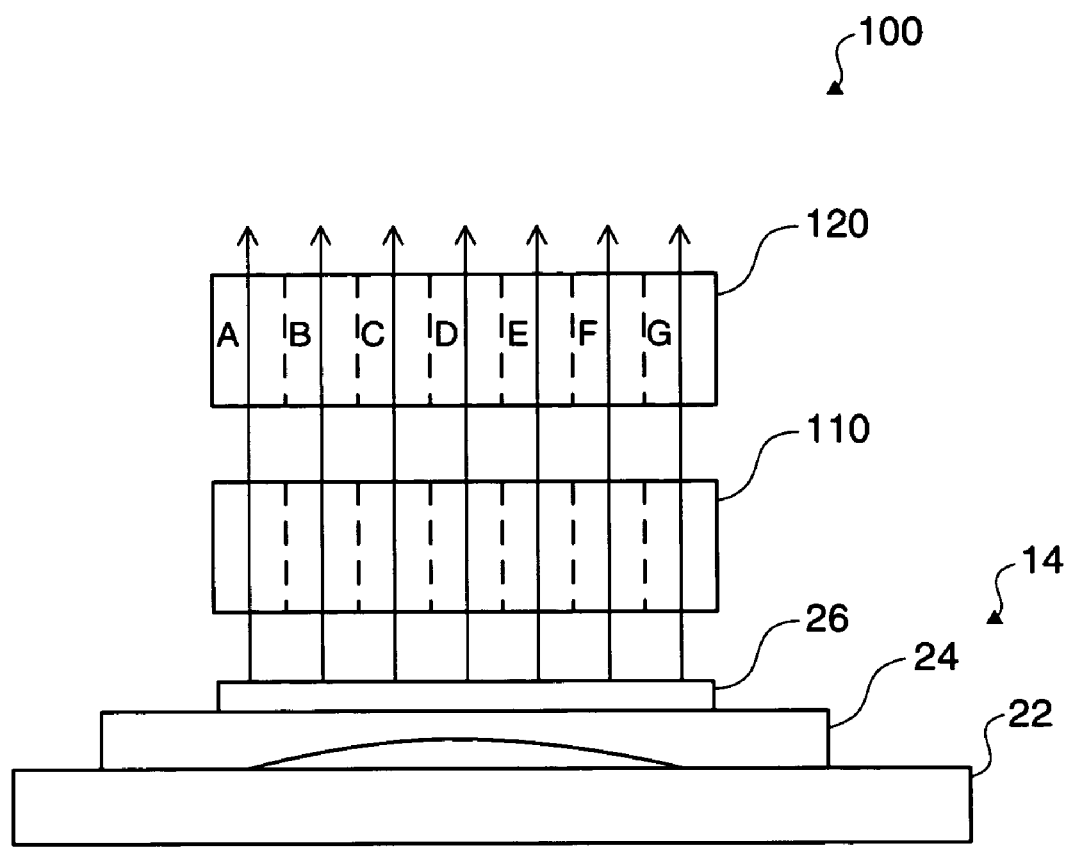
FIG. 5 is a schematic configuration diagram of a laser light source unit according to the fifth embodiment.

FIG. 5 is a schematic configuration diagram of a laser light source unit according to the fifth embodiment applying the invention. The laser light source unit 100 according to the embodiment includes the laser light source 14 according to the third embodiment, a wavelength conversion element 110 of wavelength distribution type, and a wavelength selection element 120 of wavelength distribution type.

The wavelength conversion element 110 is formed by polarization-reversing lithium niobate added with magnesium, in which the pitch of polarization reverse is partially varied. The higher the temperature, the longer the oscillation wavelength of the laser is, and thus, the pitch of polarization reverse is narrower toward the ends of the wavelength conversion element 110.

When an optical element such as a hologram having a periodic lattice is used as the wavelength selection element 120, the periodic lattice spacing within can be easily changed by heating the wavelength selection element 120. Thus, with the simpler configuration, the coherence among lights output from regions A to G of the wavelength selection element 120 can be reduced and the speckle noise can be suppressed.

In one base, the wavelength selection element 120 having plural photoselection regions A to G having different selection wavelengths from one another are provided, and thus, the wavelengths of lights respectively output from the regions A to G vary from one to another. Therefore, the bands of the lights output from the wavelength selection element 120 are wider than in the case where the lights at the same wavelength are output from all regions, and the coherence among lights is reduced. As a result, the laser light source unit 100 with suppressed speckle noise can be obtained. The combination of the laser light source 14 of the above described third embodiment, the wavelength conversion element 110, and the wavelength selection element 120 can reduce the speckle noise produced when the laser light source unit 100 is used as a light source for a display.

As a modified example of the fifth embodiment, the laser light source 14 provided in the laser light source unit 100 may be replaced by one in the fourth embodiment.

Sixth Embodiment

Figure 6:
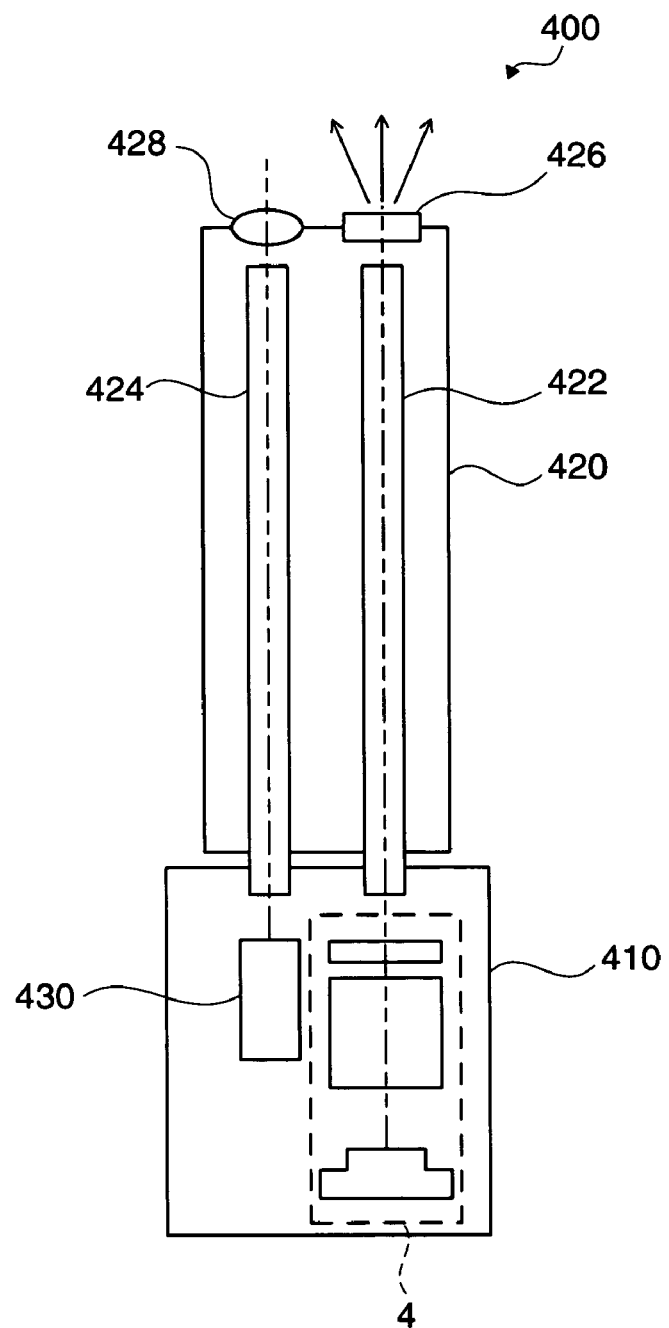
FIG. 6 is a schematic configuration diagram of a monitor apparatus according to the sixth embodiment.

FIG. 6 is a schematic configuration diagram of a monitor apparatus according to the sixth embodiment applying the invention. In the embodiment, the monitor apparatus 400 includes an apparatus main body 410 and a light transmission unit 420. The apparatus main body 410 includes the laser light source unit 4 of the above described first embodiment. The laser light source unit 4 includes the laser light source 14, the wavelength conversion element 16, the wavelength selection element 18, and the base plate 22 as has been described in the first embodiment.

The light transmission unit 420 includes two light guides 422, 424 for light transmission and reception. Each of the light guides 422, 424 is formed by bundling a number of optical fibers and can transmit a laser light in the distance. The laser light source unit 4 is provided at the light incident side of the light guide 422 for light transmission, and a diffusing plate 426 is provided at the light exit side. The laser light output from the laser light source unit 4 is transmitted through the light guide 422 to the diffusing plate 426 provided at the leading end of the light transmission unit 420, and diffused by the diffusing plate 426 for irradiation of a subject.

At the leading end of the light transmission unit 420, an imaging lens 428 is also provided, and the reflection light from the subject can be received by the imaging lens 428. The received reflection light is transmitted through the light guide 424 for reception, and transmitted to a camera 430 as imaging means provided within the apparatus main body 410. As a result, an image based on the reflection light obtained by applying the laser light output from the laser light source unit 4 to the subject can be imaged by the camera 430.

According to the monitor apparatus 400 having the above described configuration, the subject can be irradiated by the high-power laser light source unit 4, and the brightness of the imaged image obtained by the camera 430 can be improved.

As a modified example of the embodiment, the laser light source unit 4 provided in the apparatus main body 410 may be replaced by one of the first to fifth embodiments.

Seventh Embodiment

Figure 7:
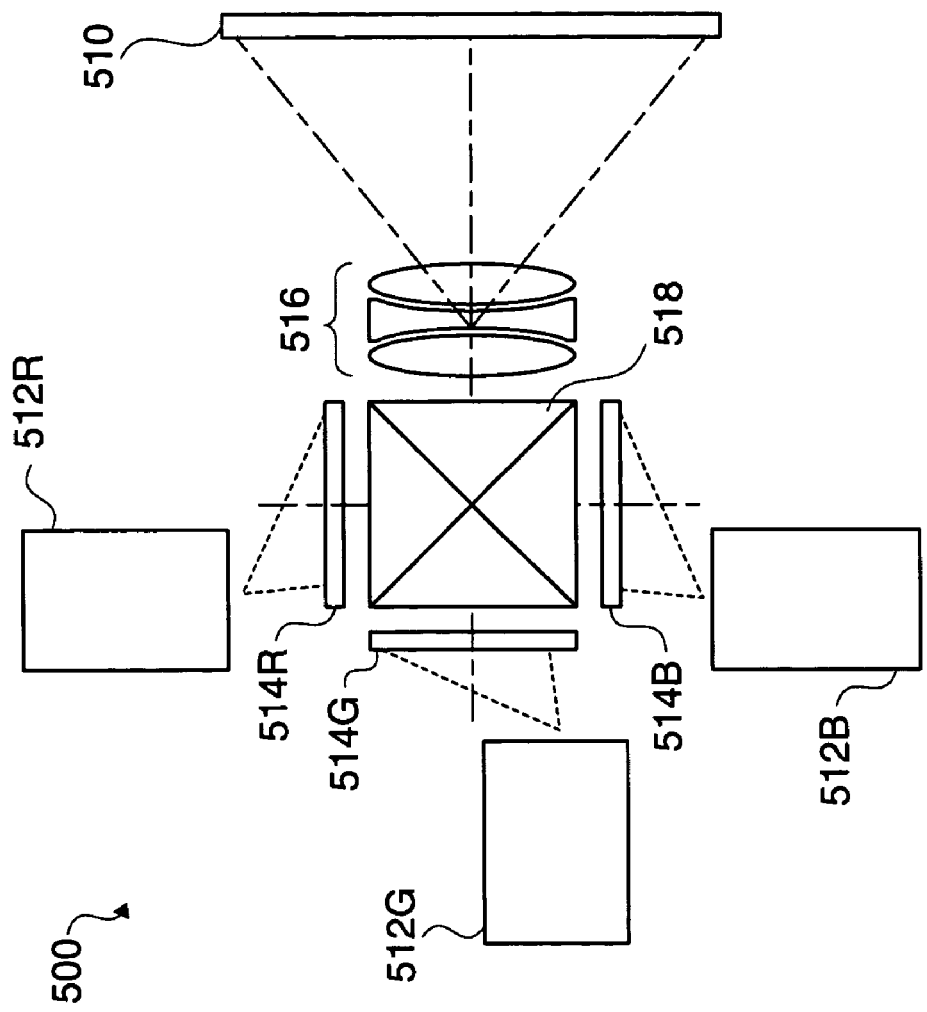
FIG. 7 is a schematic configuration diagram of an image display apparatus according to the seventh embodiment.

FIG. 7 is a schematic configuration diagram of an image display apparatus according to the seventh embodiment applying the invention. In the embodiment, a projector 500 as the image display apparatus including the laser light source unit 4 according to the above described first embodiment will be explained. In FIG. 7, a housing that configures the projector 500 is omitted for simplification. The projector 500 according to the embodiment is a front-projection projector with which light is supplied to a screen 510 and an image is viewed by observation of the light reflected on a screen 510. The description overlapping with the description of the above described first embodiment will be omitted.

As shown in FIG. 7, the projector 500 includes a red illumination device 512R that outputs red light, a green illumination device 512G that outputs green light, and a blue illumination device 512B that outputs blue light.

The red illumination device 512R, the green illumination device 512G, and the blue illumination device 512B respectively have the same configuration as that of the illumination device 2 of the above described first embodiment. The illumination device 2 includes the laser light source unit 4 and the diffusing element 12 that diffuses the laser light output from the laser light source unit 4. The wavelength conversion from infrared laser light into red is performed in the wavelength conversion element 16 provided in the red illumination device 512R, and the wavelength conversion from infrared laser light into green is performed in the wavelength conversion element 16 provided in the green illumination device 512G. Further, the wavelength conversion from infrared laser light into blue is performed in the wavelength conversion element 16 provided in the blue illumination device 512B.

The projector 500 includes liquid crystal light valves 514R, 514G, 514B that modulate illumination lights output from the illumination devices 512R, 512G, 512B of the respective colors according to image signals transmitted from a personal computer or the like, respectively. Further, the projector 500 includes a cross dichroic prism 518 that combines the lights output from the liquid crystal light valves 514R, 514G, 514B and guides the light to a projection lens 516. Furthermore, the projector 500 includes the projection lens 516 as projection means that magnifies the image formed by the liquid crystal light valves 514R, 514G, 514B and projects it onto the screen 510.

The three color lights modulated by the respective liquid crystal light valves 514R, 514G, 514B enter the cross dichroic prism 518. The prism is formed by bonding four right angle prisms, and has a dielectric multilayer film that reflects red light and a dielectric multilayer film that reflects blue light are provided inside in a cross shape. The three color lights are combined by these dielectric multilayer films and a light representing a color image is formed. Then, the combined light is projected onto the screen 510 by the projection lens 516 and the magnified image is displayed.

According to the projector 500 having the above described configuration, high-brightness images can be displayed using a laser as a light source.

It is obvious that the first to fifth embodiments may be applied to the above described projector 500 of the embodiment.

Further, the projector 500 of the embodiment has been a so-called 3-LCD projector, however, instead, a 1-LCD projector capable of color display with only one light valve by turning on a laser light source with respect to each color in a time-sharing mode may be used. A projector of the system of displaying images by scanning a beam-shaped laser light may be used. The projector may be a so-called rear projector with which light is supplied to one side of a screen and images are viewed by observation of the light output from the other side of the screen. As a spatial light modulator, not limited to the case of using the transmissive liquid crystal display apparatus, a reflective liquid crystal display apparatus (Liquid Crystal On Silicon, LCOS), DMD (Digital Micro mirror Device), GLV (Grating Light Valve), or the like may be used.

Various kinds of embodiments of the invention have been described as above, however, it will be obvious that the invention is not limited to the embodiments and various configurations may be adopted without departing from the scope of the invention.

The entire disclosure of Japanese Patent Application No. 2007-031625, filed Feb. 13, 2007 is expressly incorporated by reference herein.

What is claimed is:

1. A laser light source comprising:
    a laser array in which plural emitters are arranged, the plural emitters including a first emitter, a second emitter, and a third emitter, the second emitter being disposed between the first emitter and the third emitter;
    a submount having first and second surfaces facing in opposite directions, the laser array provided on the first surface;
    a base plate having a surface on which the submount is provided with the second surface of the submount facing the surface; and
    a joining member provided between the base plate and the submount,
    wherein:
    a distance between the first surface and the second surface of the submount is larger under the second emitter than under the first emitter;
    a distance between the first surface and the second surface of the submount is larger under the third emitter than under the second emitter; and
    a coefficient of thermal conductivity of the submount is smaller than a coefficient of thermal conductivity of the joining member.

2. The laser light source according to claim 1, wherein the first surface of the submount is a flat surface, and
    the second surface of the submount has at least one concave portion located in a region that at least overlaps with the laser array.

3. The laser light source according to claim 1, wherein the first surface of the submount is a flat surface, and
    the second surface of the submount has at least one convex portion located in a region that at least overlaps with the laser array.

4. The laser light source according to claim 3, wherein the submount has two projecting portions on a peripheral part of the second surface, and
    lengths from the first surface to ends of the respective projecting portions are equal to a length from the first surface to an end of the convex portion of the second surface.

5. A laser light source unit comprising the laser light source according to claim 1.

6. The laser light source unit according to claim 5 further comprising a wavelength conversion element that converts a wavelength of light emitted from the laser light source.

7. The laser light source unit according to claim 5 further comprising a wavelength selection element that selectively turns light at a specific wavelength back to the laser light source to allow the laser light source to laser oscillate at the specific wavelength.

8. The laser light source unit according to claim 5 further comprising:
    a wavelength selection element of wave distribution type that wavelength-selects plural different wavelengths at different locations; and
    a wavelength conversion element of wave distribution type that wavelength-converts plural different wavelengths at different locations.

9. An illumination device comprising the laser light source unit according to claim 5.

10. A monitor apparatus comprising:
    the laser light source unit according to claim 5; and
    an imaging unit that images a subject irradiated by the laser light source unit.

11. An image display apparatus comprising:
    the laser light source unit according to claim 5; and
    a projection unit that projects light output from the laser light source unit and modulated according to an image signal.

12. The laser light source according to claim 2, wherein the second surface of the submount comprises a curved surface extending under the first emitter, the second emitter, and the third emitter.

13. The laser light source according to claim 2, wherein the second surface of the submount comprises at least one of a stepped shape and a jagged shape extending under the first emitter, the second emitter, and the third emitter.

* * * * *